(12) United States Patent
Jang et al.

(10) Patent No.: US 11,016,400 B1
(45) Date of Patent: May 25, 2021

(54) EXTREME ULTRAVIOLET EXPOSURE SYSTEM

(71) Applicant: SAMSUNG ELECTRONICS CO., LTD., Suwon-si (KR)

(72) Inventors: Sungho Jang, Hwaseong-si (KR); Sungyeol Kim, Yongin-si (KR); Hyuck Shin, Bucheon-si (KR); Keunhee Bai, Suwon-si (KR); Injae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/880,090

(22) Filed: May 21, 2020

(30) Foreign Application Priority Data

Oct. 30, 2019 (KR) ........................ 10-2019-0136669

(51) Int. Cl.
*G03F 7/20* (2006.01)

(52) U.S. Cl.
CPC ...... *G03F 7/70916* (2013.01); *G03F 7/70033* (2013.01); *G03F 7/70741* (2013.01); *G03F 7/70808* (2013.01)

(58) Field of Classification Search
CPC ............ G03F 7/70916; G03F 7/70808; G03F 7/70033; G03F 7/70741
USPC ...................................... 355/72–76; 361/234
See application file for complete search history.

(56) References Cited

U.S. PATENT DOCUMENTS

| | | | |
|---|---|---|---|
| 7,551,265 B2 | 6/2009 | Phillips | |
| 7,875,864 B2 | 1/2011 | Sogard | |
| 8,115,901 B2 | 2/2012 | Hayashi | |
| 9,711,386 B2 * | 7/2017 | Cox | H01L 21/6833 |
| 10,338,477 B2 | 7/2019 | Kim et al. | |
| 2008/0037196 A1 * | 2/2008 | Yonekura | H01L 21/6831 361/234 |
| 2011/0037960 A1 | 2/2011 | Scaccabarozzi et al. | |
| 2011/0102965 A1 * | 5/2011 | Fujisawa | H01L 21/6833 361/234 |
| 2014/0253887 A1 | 9/2014 | Wu et al. | |
| 2014/0268074 A1 | 9/2014 | Chien et al. | |
| 2016/0147137 A1 | 5/2016 | Shih et al. | |
| 2020/0225572 A1 * | 7/2020 | Kim | G03F 1/42 |

FOREIGN PATENT DOCUMENTS

| | | | | |
|---|---|---|---|---|
| JP | 2009-70982 A | | 4/2009 | |
| JP | 5304097 B2 | | 10/2013 | |
| JP | 2014057013 | * | 1/2014 | ........... H01L 21/683 |

* cited by examiner

*Primary Examiner* — Hung Nguyen
(74) *Attorney, Agent, or Firm* — Sughrue Mion, PLLC (57) ABSTRACT

An extreme ultraviolet exposure system includes an exposure chamber having an internal space, upper and lower electrostatic chucks, a power supply, a light source, and a mask. The upper electrostatic chuck includes first and second electrodes that are adjacent to one another and that generate an electric field of different polarities, respectively, to provide an electrostatic force. The mask is attachable to the lower surface of the upper electrostatic chuck by the electrostatic force. The mask has a metal thin film pattern including a first region in which a metal thin film that shields the electric field, and a second region in which the metal thin film is not disposed and through which the electric field is transmitted. When the mask is attached, the electric field transmitted through the second region applies an attractive force or a repulsive force to charged particles in the exposure chamber.

12 Claims, 10 Drawing Sheets

EXTREME ULTRAVIOLET EXPOSURE SYSTEM

CROSS-REFERENCE TO RELATED APPLICATION

This application claims priority from Korean Patent Application No. 10-2019-0136669 filed on Oct. 30, 2019 in the Korean Intellectual Property Office, the disclosure of which is incorporated reference herein by in its entirety.

BACKGROUND

1. Field

The present disclosure relates to an extreme ultraviolet exposure system.

2. Description of Related Art

In a related art exposure system, a light transmissive exposure system using deep ultraviolet (DUV) light as a light source has been widely used, but recently, as integration density of semiconductor devices are improved and line widths become finer, next-generation lithography technologies have been studied to improve a resolution of optical lithography. Among the lithography technologies, development of an extreme ultraviolet exposure system as a light source using extreme ultraviolet (EUV) light, having a shorter wavelength than deep ultraviolet light, has been actively conducted. In order to effectively operate the extreme ultraviolet exposure system, a method of removing particles from the interior of an extreme ultraviolet exposure system using airflow has been used, but since the interior of the extreme ultraviolet system is maintained in a low vacuum state to prevent absorption of extreme ultraviolet light by gas, there has been a limitation in removing particles through the airflow. In particular, particles charged with a particular charge may be electrostatically adsorbed to surfaces of structures and components interior the extreme ultraviolet exposure system, making them difficult to remove with airflow.

SUMMARY

It is an aspect to provide an exposure system capable of effectively removing charged particles in an extreme ultraviolet exposure chamber.

According to an aspect of an example embodiment, there is provided an extreme ultraviolet exposure system that includes an exposure chamber having an internal space; an upper electrostatic chuck that is disposed in the internal space, the upper electrostatic chuck including a first electrode and a second electrode adjacent to one another in a first direction that is parallel to a lower surface of the upper electrostatic chuck, and the first and second electrodes generating an electric field of different polarities, respectively, to provide an electrostatic force; a power supply that supplies power to the upper electrostatic chuck; a light source that is disposed in the internal space and irradiates extreme ultraviolet light in a direction of the upper electrostatic chuck; a lower electrostatic chuck that is disposed in the internal space; and a mask that is attachable to the lower surface of the upper electrostatic chuck by the electrostatic force, the mask having a metal thin film pattern including a first region in which a metal thin film that shields the electric field is disposed, and a second region in which the metal thin film is not disposed and through which the electric field is transmitted, wherein, when the mask is attached to the upper electrostatic chuck, the electric field transmitted through the second region applies an attractive force or a repulsive force to charged particles in the exposure chamber.

According to another aspect of an example embodiment, there is provided an extreme ultraviolet exposure system including an exposure chamber; an upper electrostatic chuck that is disposed in the exposure chamber, and includes a first electrode and a second electrode alternately disposed on a lower surface thereof, the first and second electrodes generating an electric field having different polarities, respectively, to provide an electrostatic force; and a mask that is attachable to the lower surface of the upper electrostatic chuck by the electrostatic force, and that comprises a metal thin film pattern selectively shielding the electric field generated by the first and second electrodes.

According to another aspect of an example embodiment, there is provided an extreme ultraviolet exposure system including an exposure chamber having an internal space; an upper electrostatic chuck that is disposed in the internal space, and that includes a first electrode and a second electrode alternately disposed on a lower surface of the upper electrostatic chuck, the first and second electrodes generating an electric field having different polarities, respectively, to provide an electrostatic force; a lower electrostatic chuck that is disposed in the internal space; a first mask that is attachable to the lower surface of the upper electrostatic chuck by the electrostatic force, and that comprises a metal thin film pattern selectively shielding the electric field generated by the first and second electrodes; and a second mask that is attachable to the lower surface of the upper electrostatic chuck by the electrostatic force, and having a metal thin film pattern shielding the electric field generated by the first and second electrodes, wherein, when the first mask is attached to the upper electrostatic chuck, charged particles in the exposure chamber are attracted and attached to a surface of the first mask by the electric field having a first polarity of the different polarities that is selectively transmitted through the first mask, and when the second mask is attached to the upper electrostatic chuck, the electric field is shielded to allow exposure of a wafer in the exposure chamber.

According to another aspect of an example embodiment, there is provided an extreme ultraviolet exposure system including an exposure chamber having an internal space that is maintained at a pressure of about 5 Pa or less; an electrostatic chuck that is disposed in the internal space, and that includes a first electrode and a second electrode that generate an electric field having different polarities, respectively, to provide an electrostatic force; and a light source that is disposed in the internal space and irradiates extreme ultraviolet light to expose a wafer in an exposure configuration of the extreme ultraviolet exposure system, wherein, in a cleaning configuration, a first mask is attached to a lower surface of the electrostatic chuck by the electrostatic force, the first mask comprising a metal thin film pattern that shields a portion of the electric field generated by the first and second electrodes such that charged particles in the exposure chamber are attracted and attached to a surface of the first mask or repelled away from the first mask by a portion of the electric field that is transmitted through the first mask.

BRIEF DESCRIPTION OF DRAWINGS

The above and other aspects will be more clearly understood from the following detailed description, taken in conjunction with the accompanying drawings, in which:

FIGS. 6 to 9B illustrate various modified examples of the first mask of FIGS. 2 and 3.

DETAILED DESCRIPTION

Hereinafter, example embodiments will be described with reference to the accompanying drawings.

Figure 1:
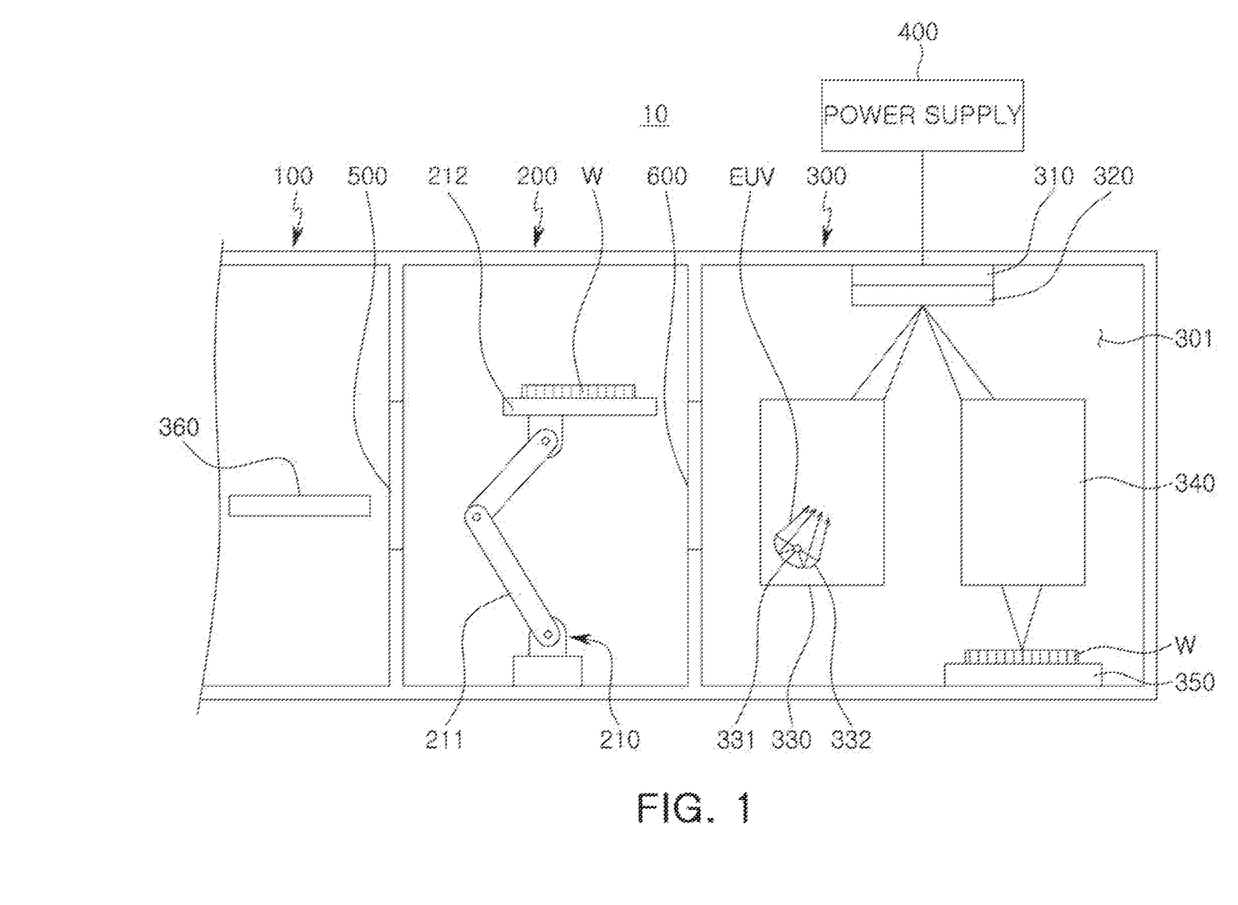
FIG. 1 is a schematic view illustrating an extreme ultraviolet exposure system according to an example embodiment.
Figure 2:
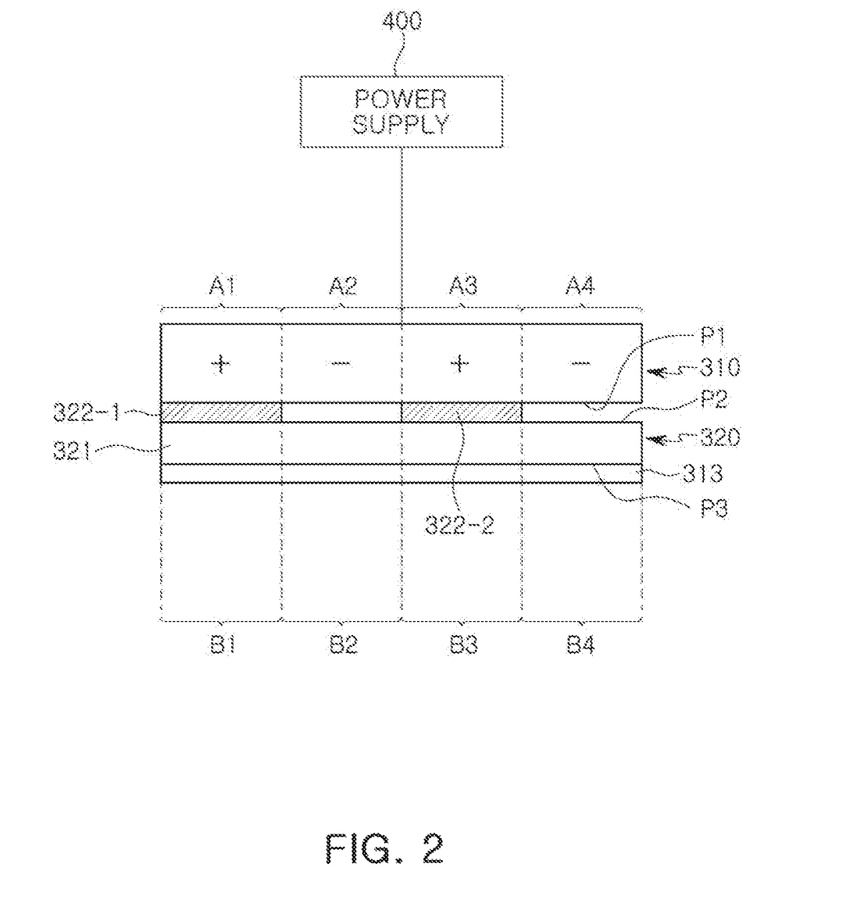
FIG. 2 is a view illustrating an upper electrostatic chuck and a first mask of the extreme ultraviolet exposure system of FIG. 1.
Figure 3:
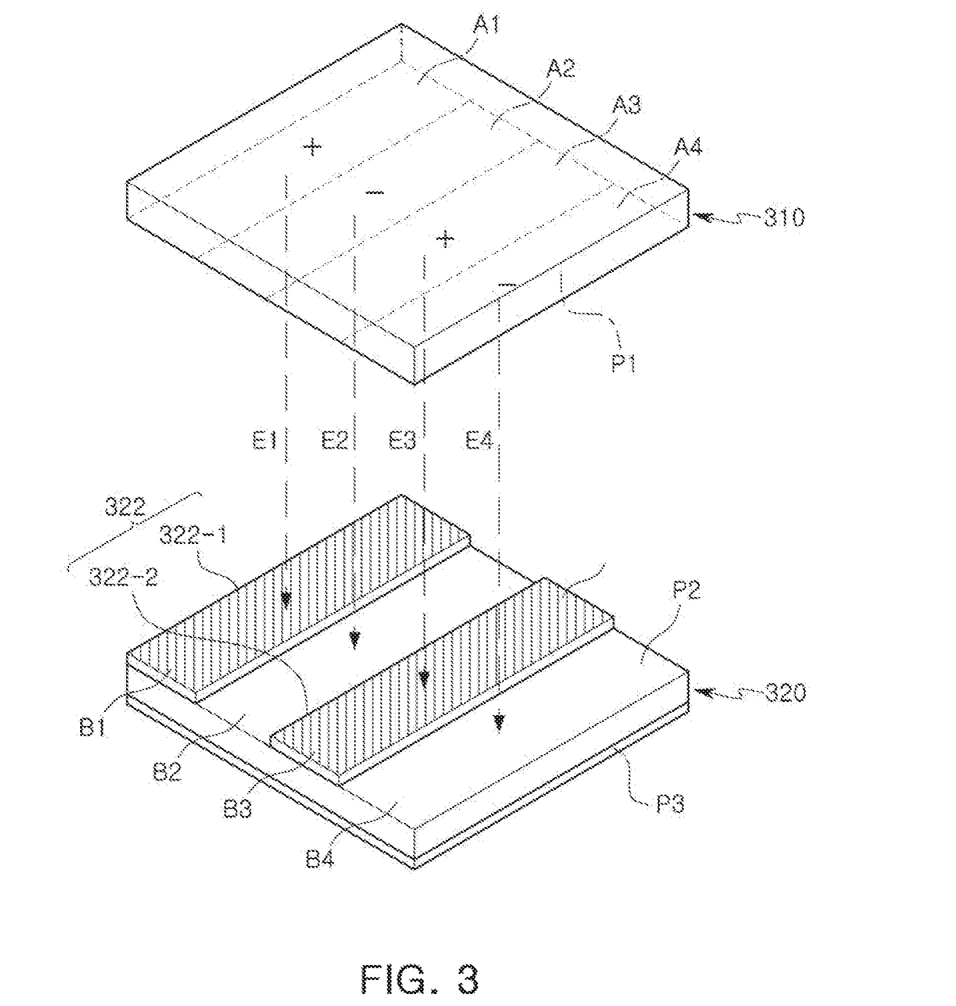
FIG. 3 is an exploded perspective view illustrating the upper electrostatic chuck and the first mask of FIG. 2.

Referring to FIGS. 1 to 3, an extreme ultraviolet exposure system according to an example embodiment will be described. FIG. 1 is a schematic view illustrating an extreme ultraviolet exposure system according to an example embodiment, and FIG. 2 is a view illustrating an upper electrostatic chuck and a first mask of the extreme ultraviolet exposure system of FIG. 1. FIG. 3 is an exploded perspective view illustrating the upper electrostatic chuck and the first mask of FIG. 2.

Referring to FIG. 1, an extreme ultraviolet (EUV) exposure system 10 may include a load lock chamber 100, a wafer exchange chamber 200, and an exposure chamber 300. The extreme ultraviolet exposure system 10 may be a device that performs extreme ultraviolet exposure on a wafer W coated with a photoresist.

The load lock chamber 100 may be a chamber that functions as a path for supplying and discharging the wafer W to the exposure chamber 300 from a spinner performing a photoresist coating process and a development process. The load lock chamber 100 may be disposed at an inlet-side and/or an outlet-side of the exposure chamber 300. The load lock chamber 100 may selectively maintain an atmospheric pressure state and a vacuum state. The wafer may refer to a semiconductor substrate on which an extreme ultraviolet photolithography process, for example, ultraviolet exposure, is performed, to form a pattern. Here, the wafer may include any kind of substrates on which extreme ultraviolet exposure may be performed without being limited to the semiconductor substrate.

The wafer exchange chamber 200 may be coupled to the load lock chamber 100 through a first door 500, and may be coupled to the exposure chamber 300 through a second door 600. A transfer robot 210 for moving the wafer W may be disposed in the wafer exchange chamber 200. The transfer robot 210 may have a multi-stage arm 211, and an arm spoon 212 on which the wafer W is placed may be disposed in an end portion of the multi-stage arm 211. When the first door 500 is opened, the transfer robot 210 may select the wafer W to be processed from the load lock chamber 100 to be loaded on the arm spoon 212. In addition, when the second door 600 is opened, the transfer robot 210 may load the loaded wafer W into the exposure chamber 300. In addition, when an exposure process of the wafer W is completed, the transfer robot 210 may unload the wafer W from the exposure chamber 300 and then transfer the wafer W to the load lock chamber 100 again. In addition, the transfer robot 210 may be used to load/unload a first mask 320 and a second mask 360 to be described below to an upper electrostatic chuck (ESC) 310.

However, a structure of the transfer robot 210 is not limited thereto, and other transporting devices may be used in the wafer exchange chamber 200 instead of the transfer robot 210.

The exposure chamber 300 may have an internal space 301, and may include a light source 330, the upper electrostatic chuck (ESC) 310, a projection unit 340, and a lower electrostatic chuck 350 in the internal space 301 thereof. The first and second masks 320 and 360 may be loaded/unloaded on the upper electrostatic chuck 310, and the wafer W may be loaded/unloaded on the lower electrostatic chuck 350. The first mask 320 may be a mask for removing particles in the interior of the exposure chamber 300, which will be described later. The second mask 360 may be a mask for irradiating a pattern on the photoresist of the wafer W. The internal space of the exposure chamber 300 may be in a low-pressure state or a vacuum state of about 5 Pa or less to prevent absorption of extreme ultraviolet light into a gas.

The light source 330 may include an extreme ultraviolet light source 331, and may generate extreme ultraviolet light (EUV) having a wavelength of less than about 100 nm. The extreme ultraviolet light source 331 may be, for example, a plasma source or a synchrotron light source. In addition, the plasma light source may be a laser-produced plasma (LPP) light source targeting tin (Sn) using a $CO_2$ laser as an excitation light source. The light source 330 may include a plurality of mirrors to irradiate extreme ultraviolet light (EUV) emitted from the extreme ultraviolet light source 331 in a direction of the upper electrostatic chuck 310. It is noted that, in FIG. 1, only the first mirror 332 for collecting extreme ultraviolet light from the extreme ultraviolet light source 331 and supplying the extreme ultraviolet light to other lighting mirrors is shown, and the remaining mirrors are omitted for simplicity and convenience of explanation.

Referring to FIG. 1, the upper electrostatic chuck 310 may be disposed above the internal space 301. The upper electrostatic chuck 310 may include a plurality of first electrodes and a plurality of second electrodes. For example, referring to FIGS. 2 and 4, the upper electrostatic chuck 310 may include first electrodes A1 and A3 and second electrodes A2 and A4, for generating an electric field, and the first electrodes A1 and A3 and the second electrodes A2 and A4 may be alternately disposed on a lower surface P1 of the upper electrostatic chuck 310. In an example embodiment, the first electrodes A1 and A3 and the second electrodes A2 and A4 may be disposed to be adjacent to each other in a horizontal direction, parallel to the lower surface P1 of the upper electrostatic chuck 310. The first electrodes A1 and A3 and the second electrodes A2 and A4 may use power applied from a power supply 400 to form electric fields having different polarities, thereby providing electrostatic force in a downward direction.

Figure 4:
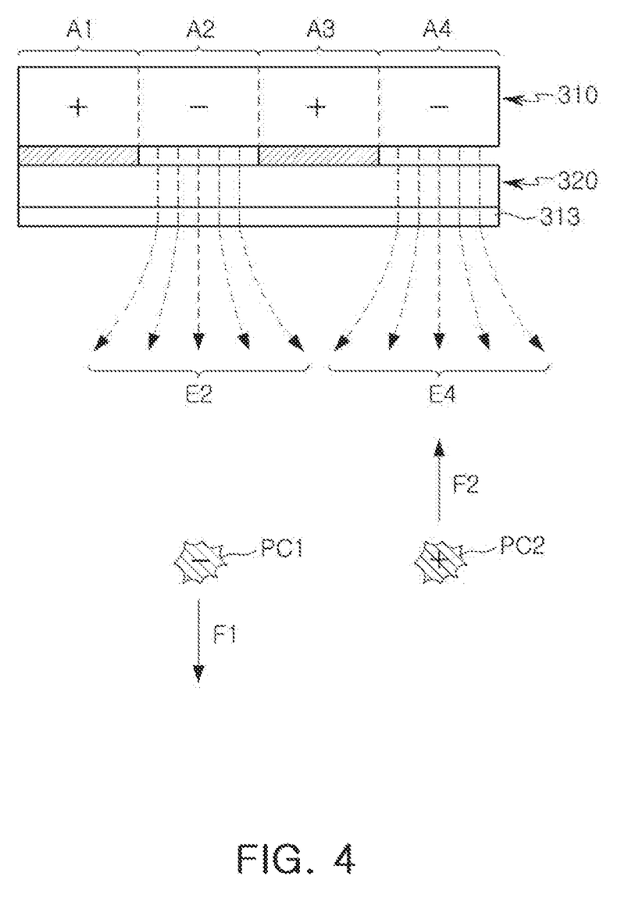
FIGS. 4 and 5 are views illustrating a process of removing charged particles using an extreme ultraviolet exposure system according to an example embodiment.

In an example embodiment, the first electrodes A1 and A3 and the second electrodes A2 and A4 may have a rectangular shape that is long in one direction, respectively, and two thereof are alternately disposed, respectively. In addition, the first electrodes A1 and A3 and the second electrodes A2 and A4 may have the same shapes. In addition, an electric field of (+) polarity may be formed in the first electrodes A1 and A3, and an electric field (−) polarity may be formed in the second electrodes A2 and A4. However, shape, number, arrangement and polarity of the first and second electrodes A1 to A4 are not limited thereto, and may be variously modified. Since the first and second electrodes A1 to A4 form electric fields having opposite polarities, respectively, a first surface P2 of the first mask 320 may be attracted by electrostatic force to the lower surface P1 of the upper electrostatic chuck 310 and attached thereto.

A mask attracted and attached to the upper electrostatic chuck 310 may include the first mask 320 for removing particles interior the exposure chamber 300 and the second mask 360 for transferring a pattern to the wafer W. In some cases, the mask may be referred to as a reticle. An example embodiment will be described based on a case in which the first mask 320 for removing particles interior the exposure chamber 300 is employed.

Referring to FIGS. 2 and 3, the first mask 320 may include a light transmissive substrate 321 and a metal thin film pattern 322. The light transmissive substrate 321 may have the first surface P2, which is a surface that may be attached to the lower surface P1 of the upper electrostatic chuck 310 and a second surface P3 that is opposite to the first surface P2. The light transmissive substrate 321 may include a low thermal expansion material (LTEM) having a low coefficient of thermal expansion. The light transmissive substrate 321 may include, for example, quartz glass, alumina silicate glass, soda lime glass, and/or $SiO_2$—$TiO_2$ based glass.

The metal thin film pattern 322 may be disposed on the first surface P2. The metal thin film pattern 322 may provide an attractive force for the first mask 320 to be attracted to and attached to the upper electrostatic chuck 310. In addition, the metal thin film pattern 322 may include first regions B1 and B3 on which a metal thin film is disposed and second regions B2 and B4 from on which the metal thin film is not disposed. In some example embodiments, the metal thin film pattern 322 include the second regions B2 and B4 from which the metal thin film is removed. In the first regions B1 and B3, the metal thin film may be disposed to shield electric fields E1 and E3 emitted from the upper electrostatic chuck 310. In the second regions B2 and B4, the metal thin film may be not disposed or may be removed to transmit the electric fields E2 and E4 emitted from the upper electrostatic chuck 310. Therefore, the metal thin film pattern 322 may allow the electric fields E2 and E4 to be transmitted to the lower portion of the first mask 320, while providing an attractive force for attaching the first mask 320 to the upper electrostatic chuck 310. While FIGS. 2-3 show the metal thin film pattern 322 disposed on the first surface P2, this is only an example, and in some example embodiments, the metal thin film pattern 322 may be formed in the light transmissive substrate 321.

According to some example embodiments, a particle collecting layer 313 may be disposed on the second surface P3 of the light transmissive substrate 321. The particle collecting layer 313 may be provided to keep particles firmly in place when the particles are attached to the second surface P3 of the first mask 320.

The particle collecting layer 313 may be formed of a porous thin film including a plurality of nanowires or a plurality of nanotubes arranged to cross each other to form a network structure. In addition, the particle collecting layer 313 may be made of an adhesive material providing chemical adhesion. Therefore, the particles attached to the particle collecting layer 313 may remain attached to the surface of the particle collecting layer 313.

In the case of the second mask 360 for transferring the pattern to the wafer W, a metal thin film may be coated to entirely cover one surface of the light transmissive substrate 321, such that the electric fields E1 to E4 of the upper electrostatic chuck 310 may not be transmitted to the lower portion of the second mask 360. The metal thin film of the second mask 360 may prevent bending of the mask due to the electrostatic force of the upper electrostatic chuck 310, and may block the electric field of the upper electrostatic chuck 310, thereby preventing the extreme ultraviolet light of the light source 330 and the projection unit 340 from being affected by the electric fields E1 to E4 of the upper electrostatic chuck 310.

On the other hand, in the case of the first mask 320 for removing the particles interior the exposure chamber 300, a metal thin film pattern 322 from which a portion of the thin film is removed may be disposed, and a portion of electric fields, e.g., electric fields E2 and E4, of the electric fields E1 to E4 of the upper electrostatic chuck 310 may be applied to the lower portion of the first mask 320. The metal thin film pattern 322 may be coated on the first surface P2 of the light transmissive pattern 321. The metal thin film pattern 322 may be formed of a conductive metal layer. In detail, the metal thin film pattern 322 may be formed by coating a material including at least one of chromium nitride (CrN), titanium nitride (TiN), molybdenum silicide ($MoSi_2$), silicon carbide (SiC), or silicon nitride ($Si_3N_4$).

As illustrated in FIG. 3, the metal thin film pattern 322 may be disposed on the first surface P2 of the light transmissive substrate 321. The metal thin film pattern 322 may include first regions B1 and B3 on which metal thin films 322-1 and 322-2 are disposed, respectively, and second regions B2 and B4 on which the metal thin film is not disposed or on which the metal thin film is removed. In this case, the first regions B1 and B3 may be disposed in a region corresponding to the first electrodes A1 and A3 of the upper electrostatic chuck 310, and the second regions B2 and B4 may be disposed in a region corresponding to the second electrodes A2 and A4 of the upper electrostatic chuck 310. Therefore, the electric fields E1 and E3 emitted from the region in which the first electrodes A1 and A3 of the upper electrostatic chuck 310 are disposed are shielded, and the electric fields E2 and E4 emitted from a region in which the second electrodes A2 and A4 are disposed may be emitted through the first mask 320. Therefore, by using the electric fields E2 and E4 emitted in the region in which the second electrodes A2 and A4 are disposed, attractive or repulsive force may be applied to the charged particles in the exposure chamber 300. There may be many particles interior the exposure chamber 300, and a portion of the particles may be charged to a specific charge by a photoelectric effect by photons of extreme ultraviolet light, or by plasma. The charged particles as described above may be fixed to a surface of a structure and a component interior the exposure chamber 300 by the electrostatic force. In the related art, attempts were made to remove the fixed particles by generating airflow interior the exposure chamber 300. However, since the interior of the exposure chamber 300 is in a low-pressure state or a vacuum state, there was a limitation in removing the particles fixed by airflow. By contrast, according to an example embodiment, the charged particles may be removed by applying a charged or a repulsive force to the charged particles via an electromagnetic force. In this regard to this, a process for removing the charged particles will be described with reference to FIGS. 4 and 5.

Figure 5:
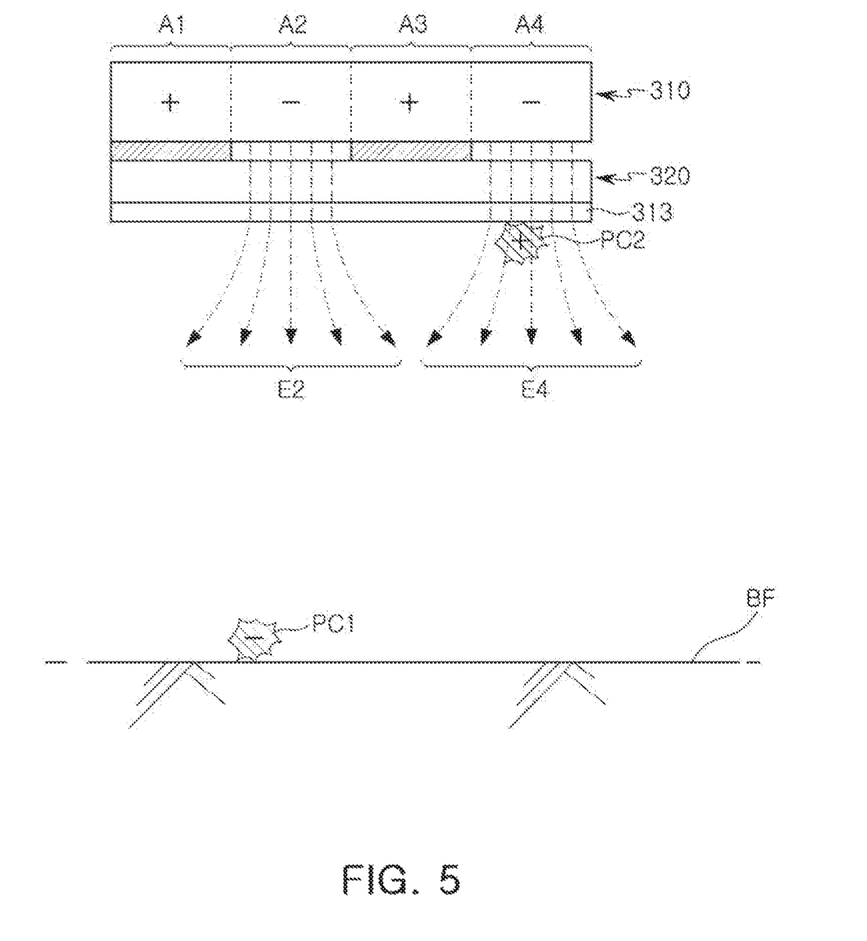

FIGS. 4 and 5 are views illustrating a process of removing charged particles using an extreme exposure system according to an example embodiment.

FIG. 4 shows that the electric fields E2 and E4 emitted from the region in which the second electrodes A2 and A4 are disposed, through the second regions B2 and B4 of the first mask 320, are emitted through the first mask 320. The emitted electric fields E2 and E4 may apply an attractive or a repulsive force to the particles depending on polarities of the charged particles. For example, a first particle PC1 charged to a negative polarity (−) may be subjected to a repulsive force F1 by an electric field of a negative polarity (−). In addition, a second particle PC2 charged to a positive polarity (+) may be subjected to an attractive force F2 by an electric field of a negative polarity (−). As a result, as shown in FIG. 5, the first particle PC1 may move in a direction away and spaced apart from the upper electrostatic chuck 310, and may be stacked on a bottom surface BF of the exposure chamber 300. On the other hand, the second particle PC2 may move in a direction toward the upper electrostatic chuck 310, and may be attached to the first mask 320 disposed below the upper electrostatic chuck 310. An example embodiment shows that the second particle PC2 is attached to the particle collecting layer 313 of the first mask 320.

Through the process as described above, the charged particles present in the exposure chamber 300 may be stacked on the bottom surface BF of the exposure chamber 300, or may be attached to the first mask 320. Therefore, the particles may be effectively removed by removing particles stacked on the bottom surface BF of the exposure chamber 300, or by unloading and discarding the first mask 320 from the upper electrostatic chuck 310. In some example embodiments, the first mask 320 may be cleaned using a cleaning process and reused. In an example embodiment, charged particles may be stacked on the bottom surface BF of the exposure chamber 300 by allowing an electric field of the same polarity as that of the charged particles to transmit through the first mask 320. In addition, the charged particles may be attached to the first mask 320 by allowing an electric field having a polarity different from that of the charged particles to transmit through the first mask 320. Therefore, the charged particles may be selectively processed according to a configuration of a metal thin film pattern 322 formed on the first mask 320.

The metal thin film pattern 322 of the first mask 320 may be variously modified. FIGS. 6 to 9B illustrate various modified examples of the first mask. Like reference numbers are provided for like elements, and the description below will focus mainly on differences from the example embodiments described with reference to FIGS. 1 and 2.

Figure 6:
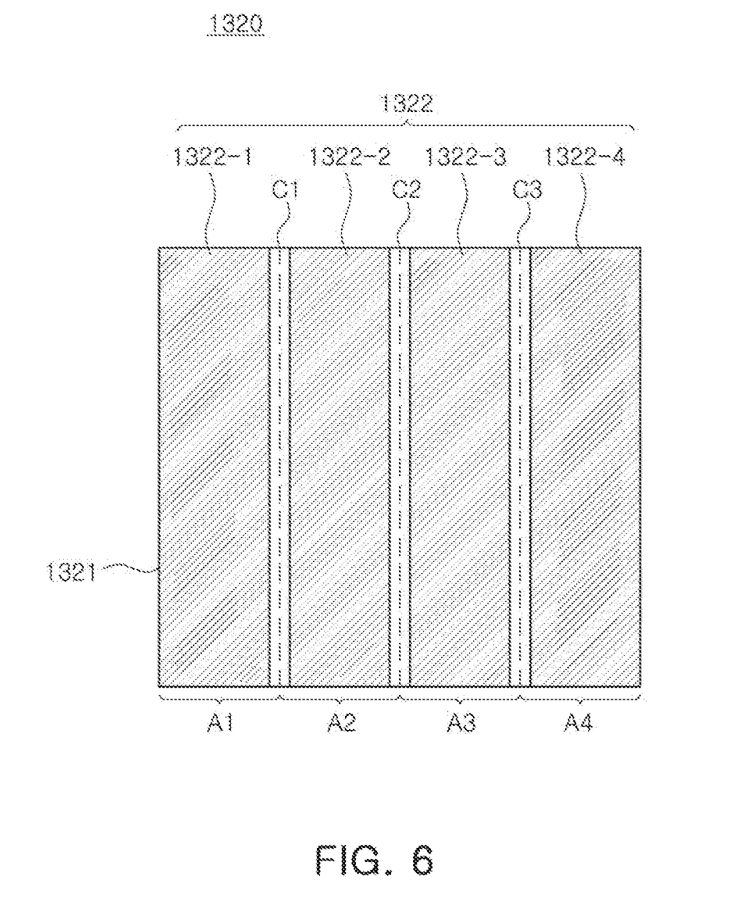

Referring to FIG. 6, first regions 1322-1 to 1322-4 of a metal thin film pattern 1322 disposed on a light transmissive substrate 1321 may be disposed in a region corresponding to first and second electrodes A1 to A4 of the upper electrostatic chuck 310, and second regions C1, C2, and C3 may be disposed in a region in which the first electrodes A1 and A3 and the second electrodes A2 and A4 are in contact with each other. The second regions C1, C2, and C3 may have a width, and the width may be predetermined. In some example embodiments, the width may be less than a width of each of the first and second electrodes. In this case, as compared to the example embodiment as described with reference to FIGS. 1-5, since an area of the metal thin film patterns 1322 is increased, a first mask 1320 may be firmly attached to the upper electrostatic chuck 310, but it may be more difficult to selectively apply the attractive or the repulsive force to charged particles depending on the polarities. While FIG. 6 shows the metal thin film pattern 1322 disposed on the first surface P2, this is only an example, and in some example embodiments, the metal thin film pattern 1322 may be formed in the light transmissive substrate 1321.

Figure 7:
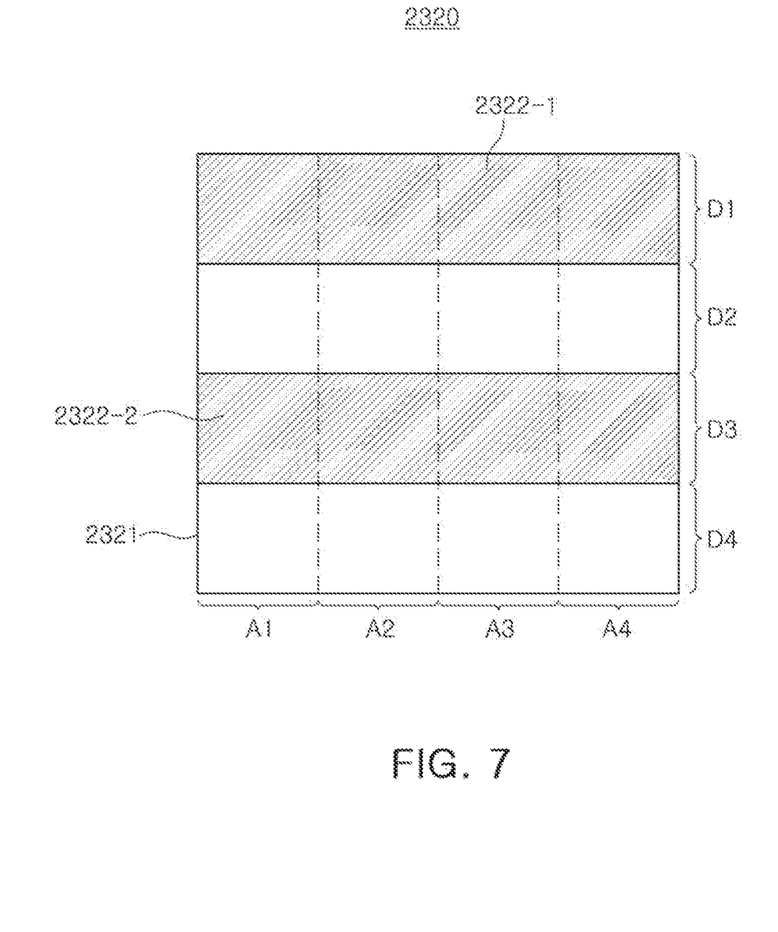

Referring to FIG. 7, metal thin film patterns 2322-1 and 2322-2 on a light transmissive substrate 2321 may be disposed such that first regions D1 and D3 and second regions D2 and D4 are orthogonal to the first and second regions A1 to A4 of the upper electrostatic chuck 310. Therefore, the metal thin film patterns 2322-1 and 2322-2 may contact both the first regions A1 and A3 and the second regions A2 and A4 of the upper electrostatic chuck 310. In this case, the first mask 2320 may be firmly attached to the upper electrostatic chuck 310, but it may be more difficult to selectively apply an attractive or a repulsive force to the charged particles according to the polarity. While FIG. 7 shows the metal thin film pattern 2322 disposed on the first surface P2, this is only an example, and in some example embodiments, the metal thin film pattern 2322 may be formed in the light transmissive substrate 2321.

Figure 8A:
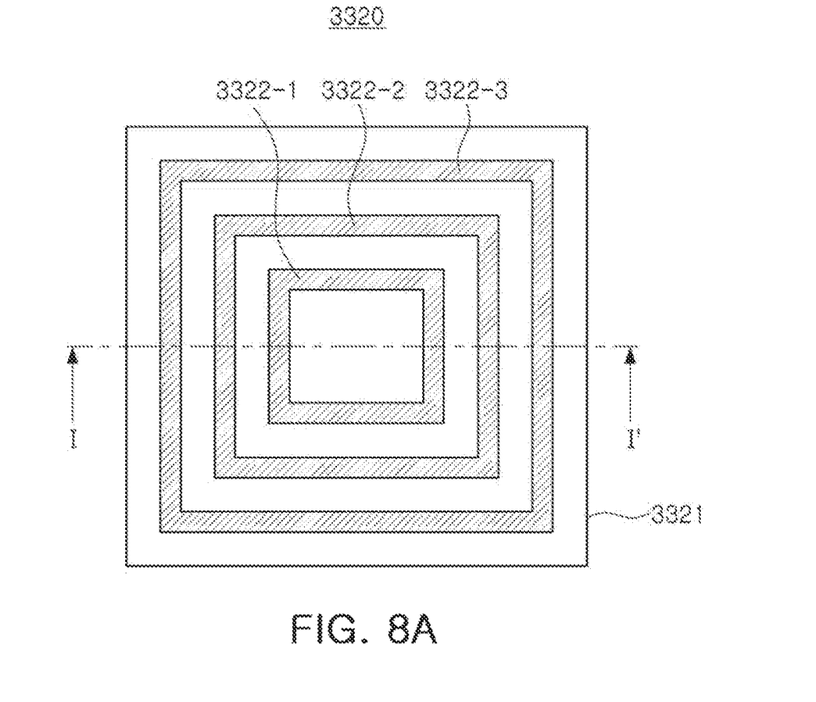
Figure 8B:
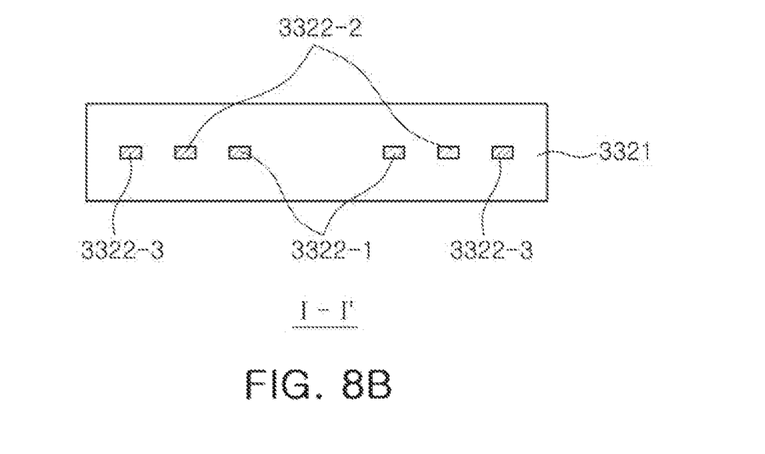

Referring to FIG. 8A, metal thin film patterns 3322-1 to 3322-3 may be disposed to have a pattern as shown in FIG. 8A. Since an electric field is blocked in a region corresponding to the metal thin film patterns 3322-1 to 3322-3, a distribution of the electric field applied to a lower region thereof may be changed according to disposition of the metal thin film patterns 3322-1 to 3322-3. In addition, referring to FIG. 8B, in some example embodiments, the metal thin film patterns 3322-1 to 3322-3 may be disposed in the light transmissive substrate 3321. It is noted that FIG. 8B shows an example in which the metal thin film patterns 3322-1 to 3322-3 of FIG. 8A may be formed in the light transmissive substrate 3321. However, this configuration is not limited to the example embodiment of FIGS. 8A-8B, and as noted above, this configuration may be applied to the example embodiments described above with respect to FIGS. 1-7.

Figure 9A:
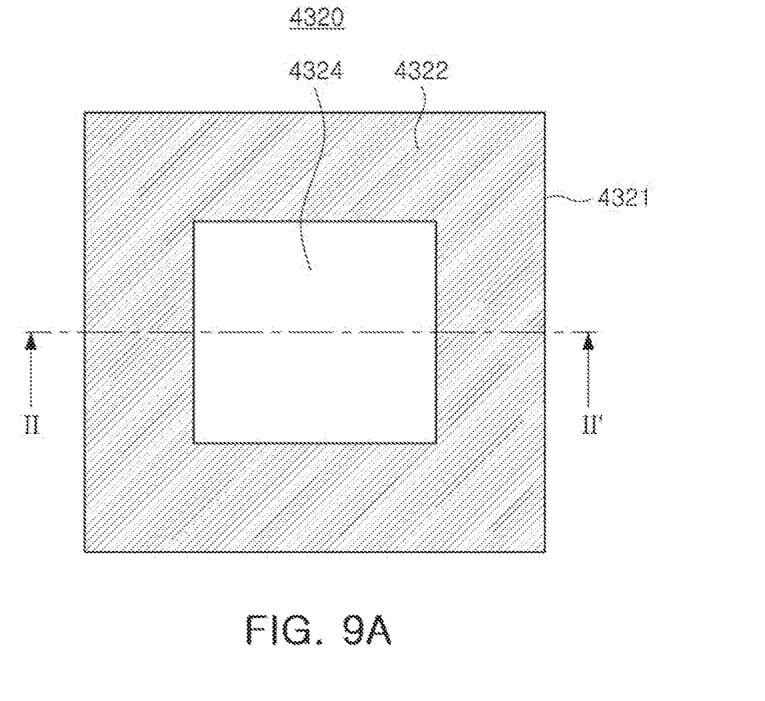
Figure 9B:
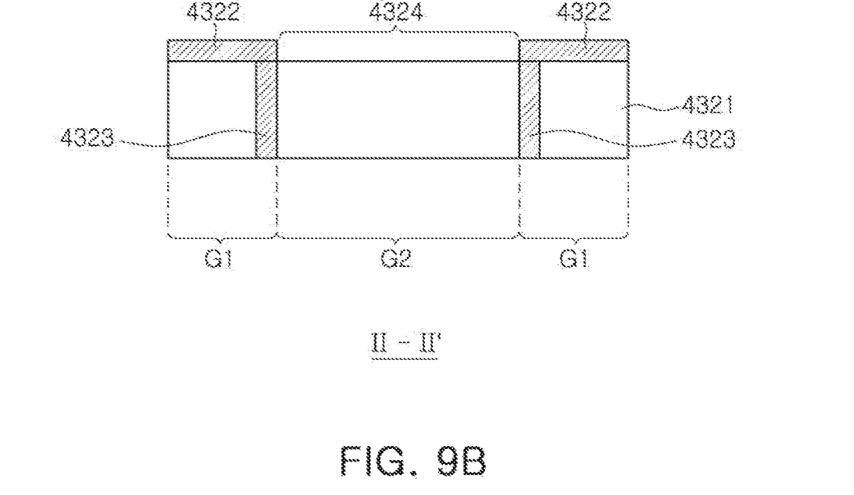

Referring to FIGS. 9A and 9B, a metal thin film pattern 4322 may have a first region G1 in which a metal thin film is disposed and a second region G2 from which a metal thin film is omitted or removed. In addition, the metal thin film pattern 4322 may have a through portion 4323 penetrating through a light transmissive substrate 4321 in a region in which the first region G1 and the second region G2 are in contact with each other. The through portion 4323 may provide an electric shielding wall to prevent the electric field emitted through the second region G2 from being directed below the first region G1.

Figure 10:
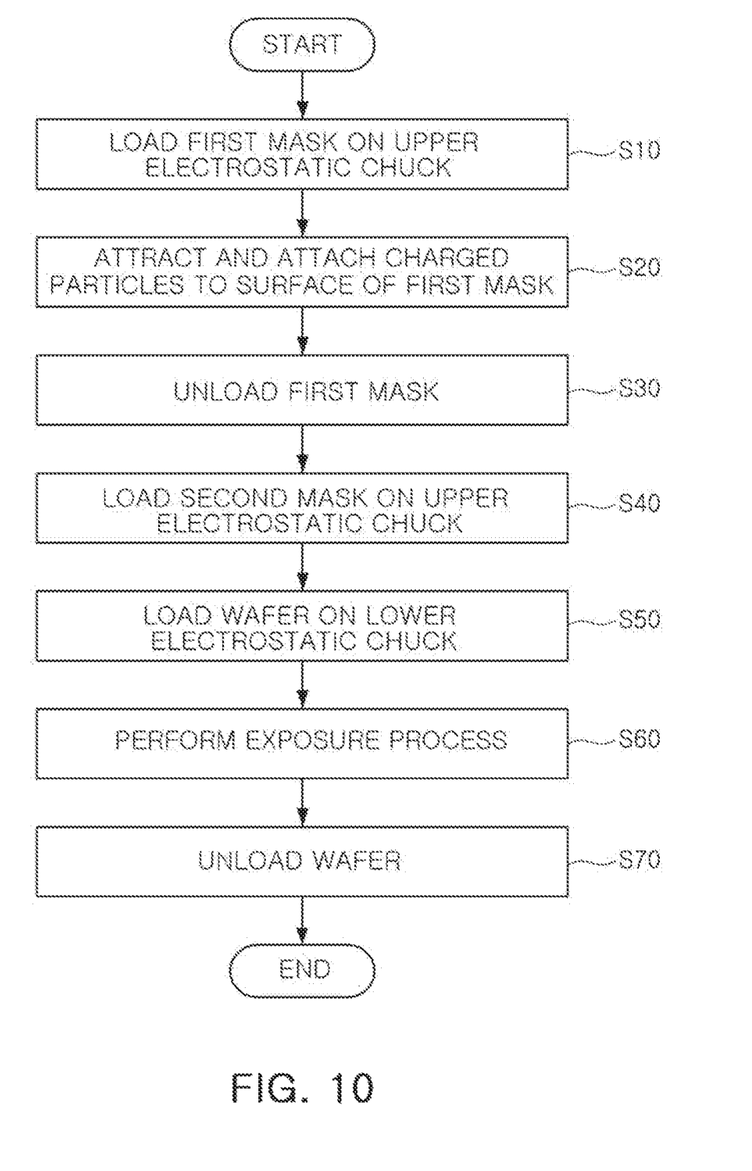
FIG. 10 is a flowchart illustrating a method of manufacturing a semiconductor device using an extreme ultraviolet exposure system according to an example embodiment.

Referring to FIG. 10, a method of manufacturing a semiconductor device using an extreme exposure system according to an example embodiment will be described. FIG. 10 is a flowchart illustrating a method of manufacturing a semiconductor device using an extreme exposure system according to an example embodiment. Reference numerals will be described with reference to FIG. 1.

First, a first mask 320 may be loaded on an upper electrostatic chuck 310 (S10), power may be applied to the upper electrostatic chuck 310 through the power supply 400, and thus charged particles in an exposure chamber 300 may be attracted and attached to the surface of the first mask 320 (S20).

Next, the first mask 320 to which the charged particles are attached may be unloaded from the upper electrostatic chuck 310 (S30). The unloaded first mask 320 may be discarded or reused through a cleaning process.

Next, a second mask 360 may be loaded on the upper electrostatic chuck 310 (S40). The second mask 360 may be used as a mask for irradiating a pattern on a photoresist applied to a wafer W in a subsequent process.

Next, the wafer W may be loaded on a lower electrostatic chuck 350 (S50), an extreme ultraviolet pattern may be irradiated onto the photoresist applied to the wafer W, and an exposure process may be performed (S60). In brief, an exposure process performed in an exposure chamber 300 will be described. The extreme ultraviolet light irradiated from a light source 330 may be incident and reflected by the second mask 360, and may be irradiated to the wafer W of the lower electrostatic chuck 350 through a projection unit 340. Through this process, the extreme ultraviolet light may be transferred to the photoresist on which a pattern of the second mask 360 is applied to the wafer W.

Next, the wafer W on which exposure is completed may be unloaded (S70). Subsequently, a process of manufacturing a semiconductor device using the wafer W on which exposure is completed may be performed.

As set forth above, according to an aspect of various example embodiments, the extreme ultraviolet exposure system may effectively remove charged particles in the interior of the exposure chamber.

The various and advantageous advantages and effects of the example embodiments are not limited to the above description, and can be more easily understood in the course of describing a specific embodiment.

While example embodiments have been shown and described above, it will be apparent to those skilled in the art that modifications and variations may be made without departing from the scope of the present disclosure as defined by the appended claims.

What is claimed is:

1. An extreme ultraviolet exposure system comprising:
an exposure chamber having an internal space;
an upper electrostatic chuck that is disposed in the internal space, the upper electrostatic chuck including a first electrode and a second electrode adjacent to one another in a first direction that is parallel to a lower surface of the upper electrostatic chuck, and the first and second electrodes generating an electric field of different polarities, respectively, to provide an electrostatic force;
a power supply that supplies power to the upper electrostatic chuck;
a light source that is disposed in the internal space and irradiates extreme ultraviolet light in a direction of the upper electrostatic chuck;
a lower electrostatic chuck that is disposed in the internal space; and
a mask that is attachable to the lower surface of the upper electrostatic chuck by the electrostatic force, the mask having a metal thin film pattern including a first region in which a metal thin film that shields the electric field is disposed, and a second region in which the metal thin film is not disposed and through which the electric field is transmitted,
wherein, when the mask is attached to the upper electrostatic chuck, the electric field transmitted through the second region applies an attractive force or a repulsive force to charged particles in the exposure chamber.

2. The extreme ultraviolet exposure system of claim 1, wherein the charged particles receive the attractive force by the electric field transmitted through the second region and are attracted to and attached to a surface of the mask.

3. The extreme ultraviolet exposure system of claim 1, wherein the charged particles receive the repulsive force by the electric field transmitted through the second region and move in a direction away from the upper electrostatic chuck.

4. The extreme ultraviolet exposure system of claim 1, wherein a voltage applied to the first and second electrodes has a different polarity and a same magnitude.

5. The extreme ultraviolet exposure system of claim 1, wherein the first region is disposed to correspond to the first electrode, and
the second region is disposed to correspond to the second electrode.

6. The extreme ultraviolet exposure system of claim 1, wherein each of the first and second regions are disposed to have portions overlapping the first and second electrodes, respectively.

7. The extreme ultraviolet exposure system of claim 1, wherein the first region is disposed to correspond to the first and second electrodes, respectively, and
the second region comprises a plurality of regions, each of the plurality of regions being disposed to correspond to a region in which the first and second electrodes are in contact with each other, and each of the plurality of regions has width less than a width of one of the first and second electrodes in the first direction.

8. The extreme ultraviolet exposure system of claim 1, wherein the first region comprises a plurality of divided regions, and
the plurality of divided regions have a same shape as each other.

9. The extreme ultraviolet exposure system of claim 1, wherein the mask comprises:
a light transmissive substrate having a first surface that is attracted to and attached to the upper electrostatic chuck and a second surface opposing the first surface; and
a particle collecting layer that is disposed on the second surface and to which the charged particles are attracted and attached.

10. The extreme ultraviolet exposure system of claim 9, wherein the particle collecting layer is formed of a porous thin film including a plurality of nanowires and a plurality of nanotubes arranged to cross each other to form a network structure.

11. The extreme ultraviolet exposure system of claim 9, wherein the particle collecting layer is formed of an adhesive material.

12. The extreme ultraviolet exposure system of claim 1, wherein the internal space has a pressure of about 5 Pa or less.

* * * * *